(12) United States Patent
Ahmad

(10) Patent No.: US 6,881,971 B2
(45) Date of Patent: Apr. 19, 2005

(54) ARRANGEMENT FOR THE SUPPRESSION OF PARTICLE EMISSION IN THE GENERATION OF RADIATION BASED ON HOT PLASMA

(75) Inventor: Imtiaz Ahmad, Goettingen (DE)

(73) Assignee: XTREME technologies GmbH, Jena (DE)

(*) Notice: Subject to any disclaimer, the term of this patent is extended or adjusted under 35 U.S.C. 154(b) by 196 days.

(21) Appl. No.: 10/407,394

(22) Filed: Apr. 4, 2003

(65) Prior Publication Data

US 2003/0190012 A1 Oct. 9, 2003

(30) Foreign Application Priority Data

Apr. 5, 2002 (DE) .......................................... 102 15 469

(51) Int. Cl.[7] .............................. H05H 1/00; H05H 1/03; H05H 1/34; H01J 17/04
(52) U.S. Cl. ................ 250/504 R; 250/365; 250/493.1; 378/119; 315/111.21
(58) Field of Search ............................ 250/504 R, 365, 250/493.1; 378/119; 315/111.21

(56) References Cited

U.S. PATENT DOCUMENTS 4,837,794 A    6/1989  Riordan et al.
6,452,194 B1 * 9/2002  Bijkerk et al. ........... 250/492.2
2004/0119394 A1 * 6/2004  Klebanoff et al. .......... 313/356

* cited by examiner

*Primary Examiner*—Nikita Wells
(74) *Attorney, Agent, or Firm*—Reed Smith LLP

(57) ABSTRACT

The invention is directed to an arrangement for the suppression of particle emission in the generation of radiation based on hot plasma in x-ray radiation sources, particularly EUV radiation sources. The object of the invention, to find a novel possibility for debris filtering in plasma-coupled radiation sources which permits a reliable retention of charged and uncharged particles without substantially reducing transmission or limiting the usable solid angle of radiation, is met, according to the invention, by an arrangement for the suppression of particle emission with generation of radiation based on a hot plasma having a vacuum chamber for generating the plasma in that the outlet opening of the vacuum chamber is followed by means for generating an electric field, wherein the electric field is oriented orthogonal to the central propagation direction of a divergent beam bundle exiting in a defined solid angle, and means for generating a gas sink so that a resulting particle flow is oriented parallel to the direction of the electric field. The particle flow is advantageously further reinforced in the direction of the gas sink by an oppositely arranged gas supply device.

13 Claims, 3 Drawing Sheets

ARRANGEMENT FOR THE SUPPRESSION OF PARTICLE EMISSION IN THE GENERATION OF RADIATION BASED ON HOT PLASMA

CROSS-REFERENCE TO RELATED APPLICATIONS

This application claims priority of German Application No. 102 15 469.4, filed Apr. 5, 2002, the complete disclosure of which is hereby incorporated by reference.

BACKGROUND OF THE INVENTION a) Field of the Invention

The invention is directed to an arrangement for the suppression of particle emission in the generation of radiation based on hot plasma in x-ray radiation sources, particularly EUV radiation sources.

b) Description of the Related Art

Soft x-ray radiation and extreme ultraviolet (EUV) radiation are applied in many areas of technology. Due to the development of highly reflecting multilayer dielectric mirrors which are suitable as collector optics for this spectral range, EUV radiation is becoming increasingly important in semiconductor lithography for the exposure of increasingly smaller structures of ULSI (Ultra Large Scale Integration) circuits.

The requirements for radiation sources for the above-mentioned jobs in semiconductor lithography could possibly also be met by a synchrotron, but the latter is very expensive and is also very inflexible due to its size. Therefore, synchrotrons have not found acceptance in the semiconductor industry for exposure of ULSI circuits.

The EUV radiation sources that have now moved into the spotlight can only be successfully used in the future if they emit sufficiently intensive radiation in the wavelength range of 13.5 nm and, at the same time, less debris. The generation of debris, that is, the emission of neutral and charged particles from the radiation-emitting plasma, is considered at present to be the most pressing problem because the life of the collector optics is considerably reduced thereby. The life of collector optics in lithography machines should be at least one year. This can not be achieved with a high debris emission even when the radiation source has a sufficiently high output to compensate to some extent for the decreasing reflectivity of the multilayer mirrors.

Various types of debris filters are currently in use but, with their characteristics, do not achieve reduction of debris to the required degree. For example, existing filters are formed of honeycombs or concentric cones. However, the baffles reduce the transmission of radiation geometrically due to shadows cast by the edges and diffraction phenomena. Increasing the quantity of filter walls or decreasing the distances between the walls in order to increase the filtering effect necessarily limits the beam bundle more narrowly.

On the other hand, an arrangement of plates lateral to the propagation direction of the radiation can guarantee a high transmission. A filter arrangement of this type for an x-ray source is known from U.S. Pat. No. 4,837,794. This reference discloses the arrangement of conical baffles outside of the beam bundle defined by the exit window and the use of a constantly renewable UV filter and a magnetic field for deflecting primary electrons in the vacuum chamber before the exit window of the radiation source in order to prevent hot gases from escaping and to prevent other unwanted components of plasma-generated x-rays. However, the usable solid angle is greatly reduced by this arrangement. When the plates are spaced farther apart in order to enlarge the solid angle, the filtering effect is reduced. Fast charged and uncharged particles are filtered out of the exiting beam bundle only to an inadequate extent with this arrangement.

Further, known mechanical shutters which quickly close the beam path after every beam pulse in order to block the slower particles can not achieve the required repetition rates (up to 10 kHz) for technical reasons.

OBJECT AND SUMMARY OF THE INVENTION

It is the primary object of the invention to find a novel possibility for debris filtering in plasma-coupled radiation sources, particularly EUV radiation sources which permits a reliable retention of charged and uncharged particles without substantially reducing transmission or limiting the usable solid angle of radiation.

According to the invention, in an arrangement for the suppression of particle emission with generation of radiation based on a hot plasma, particularly with EUV radiation generation, in which, for the purpose of generating the plasma, there is a vacuum chamber having an outlet opening for emitting the generated radiation from the vacuum chamber in a defined solid angle, the above-stated object is met in that there are means for generating an electric field, wherein the electric field is oriented orthogonal to the central propagation direction of a divergent beam bundle exiting in a defined solid angle, and means for generating a gas sink so that a resulting particle flow is oriented parallel to the direction of the electric field, which means are arranged following the outlet opening of the vacuum chamber.

Two electrodes with surfaces parallel to one another are advantageously provided for generating the electric field. The electrodes communicate with different poles of a DC voltage source, are arranged parallel to a center axis of the beam bundle, and are positioned in such a way that the beam bundle is enclosed as closely as possible by the electrodes without the beam bundle being cut into.

For this purpose, it has proven advisable that the two electrodes are constructed as concentric cylindrical jacket surfaces for generating the electric field, wherein a center electrode which is constructed as a thin perforated tube is provided with a connection to a vacuum pump, communicates with the negative pole of the DC voltage source, and is arranged along the axis of the exiting beam bundle, and an outer electrode which is constructed as a pipe that is oriented concentric to the thin tube and connected to the positive pole of the DC voltage source is arranged around the exiting beam bundle.

In a second possibility for generating the electric field, two electrodes are provided as concentric cylindrical jacket surfaces, wherein a center electrode constructed as a thin rod is arranged along the axis of the exiting beam bundle and communicates with the positive pole of the DC voltage source, an outer electrode which is constructed as a perforated pipe which is oriented concentric to the thin rod is arranged around the exiting beam bundle, and a vacuum pump is provided for evacuating the space outside of the perforated outer electrode.

The outer electrode can also be the outer surface of a regular n-sided prism, where n is advisably greater than three. Quadrangular, hexagonal or octagonal prism shapes are preferably used.

A preferred third variant for generating the electric field comprises a pair of planar electrodes which are parallel to one another, wherein at least one electrode of the pair which communicates with the negative pole of the DC voltage source is perforated and a connection for the vacuum pump is arranged behind the latter lateral to the propagation direction of the beam bundle.

A constant electric field is preferably applied between the electrodes by using capacitors between the DC voltage source and the electrodes for temporary storage of the electrical energy. It is advantageous for all of the variants mentioned above for generating the electric field when there is a plurality of pairs of parallel electrodes, wherein the pairs are electrically insulated from one another, arranged in close succession in the propagation direction of the beam bundle, and arranged in such a way that the electrodes of the pairs are at a greater distance from one another so as to be adapted to the diameter of the divergent beam bundle that increases as the distance from the radiation source increases, and a higher voltage is applied to the electrodes at the greater distance so that the loss of electric field strength caused by the distance is compensated to a great extent.

In order to generate an effective gas flow between the electrodes of a pair, both electrodes are advisably perforated and there is a separate gas supply device for each pair of electrodes, the gas supply device being controlled by a gas control unit depending on the (different) distance between the pairs of electrodes.

For accelerated lateral deflection of charged particles, a magnetic field which is orthogonal to the center axis of the beam bundle and to the direction of the electric field is advantageously provided in addition to the electric field immediately following the outlet opening of the radiation source, so that electric and magnetic forces deflect charged particles in the same direction.

With respect to any of the forms of electrode pairs described above, it is advantageous for generating an effective gas flow when both electrodes of a pair are perforated, a gas supply device is connected behind the positive electrode and a vacuum pump is connected behind the negative electrode. The two electrodes are advisably grid-shaped. Perforated plates are preferably used as electrodes.

In this connection, hydrogen or deuterium is preferably fed via the gas supply device through the positive electrode in order to generate a gas flow. There is hardly any impairment of transmission of radiation through the gas flow because of the high transparency of hydrogen. Noble gases, particularly helium, neon, argon or krypton, can also advisably be used to generate the gas flow.

The basic idea behind the invention is that an unlimited and undiminished exiting of soft x-ray radiation can be achieved extensively without debris in the exiting beam bundle only by means of "nonphysical" filters. The fundamental idea is to deflect charged particles by means of electric and/or magnetic fields assisted by gas flows which also influence neutral particles. Therefore, the debris filter according to the invention comprises pairs of parallel electrodes to which voltage is applied and between which a particle flow is generated in the direction of the developing electric field, so that charged and uncharged particles are effectively deflected from and sucked out of the beam bundle.

In a particularly advantageous construction, the pairs of electrodes are arranged in cascade fashion such that their spacing increases with the distance from the source as given by the aperture angle or opening angle of the emitted radiation and by the subsequent collector optics. Electric (and possibly magnetic) forces and a pressure gradient force the particles emitted from the plasma to change direction, so that they can not reach the sensitive collector optics.

The arrangement according to the invention makes it possible to achieve a reliable filtering (deflection) of charged and uncharged particles in plasma-coupled radiation sources, particularly EUV radiation sources, without a substantial reduction in transmission and without limiting the usable solid angle of the radiation source.

The invention will be described more fully in the following with reference to embodiment examples.

DESCRIPTION OF THE PREFERRED EMBODIMENTS

Figure 1:
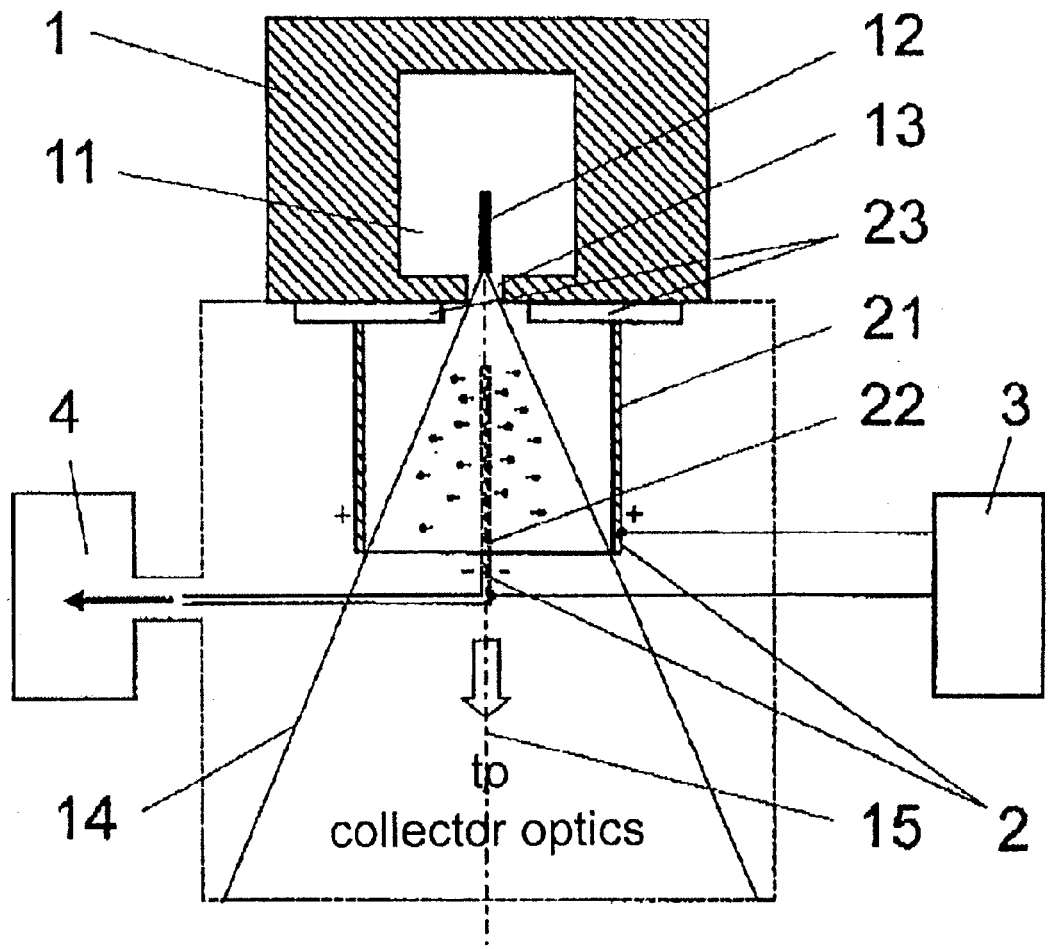
FIG. 1 is a sectional view showing an advantageous construction of the invention (debris filter) at the outlet opening of an EUV radiation source.

As is shown schematically in a sectional view in FIG. 1, the arrangement according to the invention basically comprises a plasma-coupled radiation source 1, preferably—but without limiting generality—an EUV radiation source with a vacuum chamber 11 for generating a plasma 12 (e.g., z-pinch) and an outlet opening 13 which gives the solid angle of a divergent beam bundle 14 generated by the plasma 12, at least one electrode pair 2 for generating an electric field, and a gas sink in the form of a vacuum unit 4.

The debris filter arrangement which is designed in this way is installed between the radiation source 1 and first collector optics of the application device (e.g., a lithography station in a semiconductor chip production line). The construction allows the use of radiation sources based on a gas discharge as well as radiation sources with laser-induced plasma.

The first embodiment form of the arrangement shown in FIG. 1 is substantially cylindrically symmetric. An outer electrode is constructed as a cylindrical pipe 21, a second, center electrode in the shape of a perforated, thin tube 22 being arranged concentrically therein. The outer, cylindrical pipe 21 is connected to the positive pole for generating the desired electric field and the thin, perforated center tube 22 is connected to the negative pole of a voltage source 3. While the center tube 22 has a sufficiently large distance from housing parts of the radiation source 1, the outer pipe 21 is electrically shielded by suitable insulators 23 to keep the distance small in case the radiation source 1 has parts in the area of the outlet opening 13 itself which conduct high voltage.

Further, the perforated center tube 22 is connected to a vacuum system 4 which sucks out all particles reaching the tube 22. Due to the action of the electric field between the outer pipe 21 and center tube 22, positively charged particles are accelerated radially in the direction of the tube 22, neutralized in the latter and subsequently sucked out. Further, due to the suction effect of the vacuum unit 4, uncharged particles are also drawn into the tube 22 and sucked out. Operation can also be supported in addition by means of a gas flow as will be described in the following.

Figure 2:
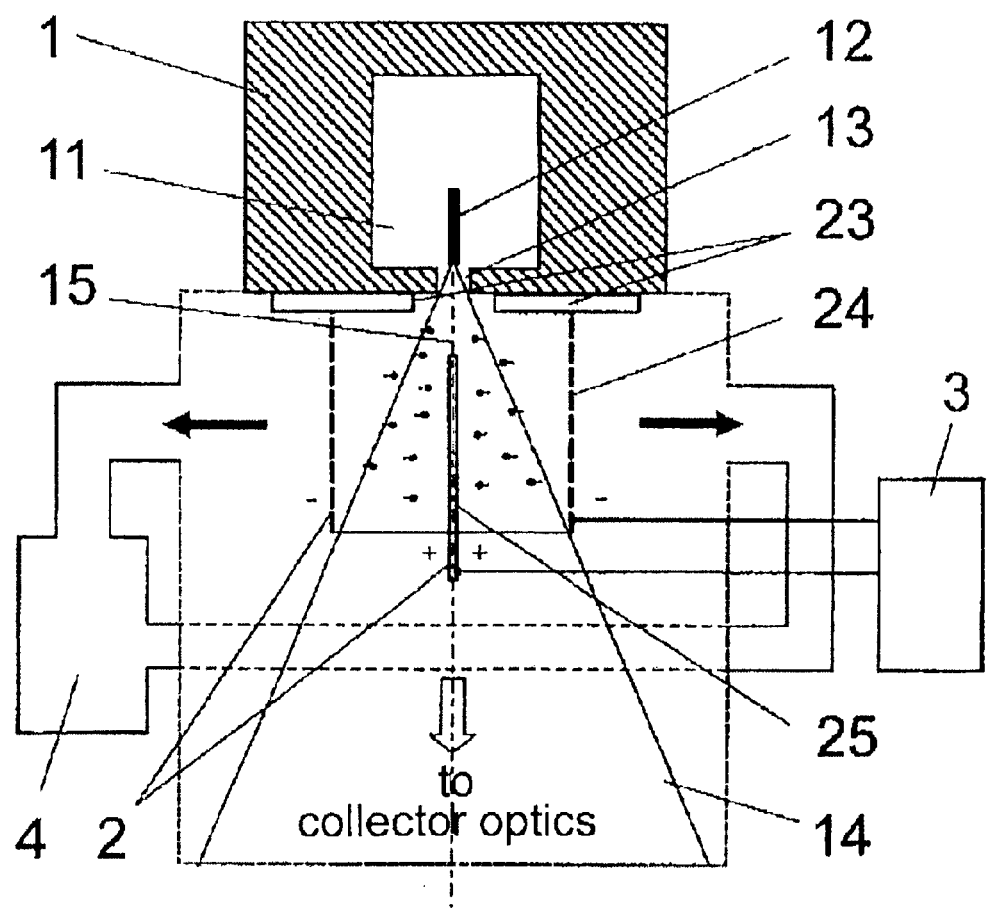
FIG. 2 shows another construction of a debris filter in concentric geometry.

Another embodiment form of the invention is shown in FIG. 2. This construction has basically the same geometric relationships as the variant shown in FIG. 1, except that the function of the electrode pair 2 is changed (switched). In this example, the outer electrode, as perforated pipe 24, is connected to the negative pole of the voltage source 3 and the center electrode is constructed in the shape of a thin rod 25 which communicates with the positive pole of the voltage source 3. In this case, positively charged particles are accelerated radially outward, neutralized on the material of the perforated pipe 24 and subsequently pumped out by the vacuum unit 4.

The thin rod 25 can also be formed of wire or as a thin tube. In the latter case, an additional gas feed (not shown in FIG. 2) through the center electrode is afforded when the tube 22 is perforated (as shown in FIG. 1), so that the existing particle flow in outward radial direction which is caused by the electric field and the suction of the vacuum unit 4 is further reinforced by the introduction of gas as will be explained in detail in the following third example.

Figure 3:
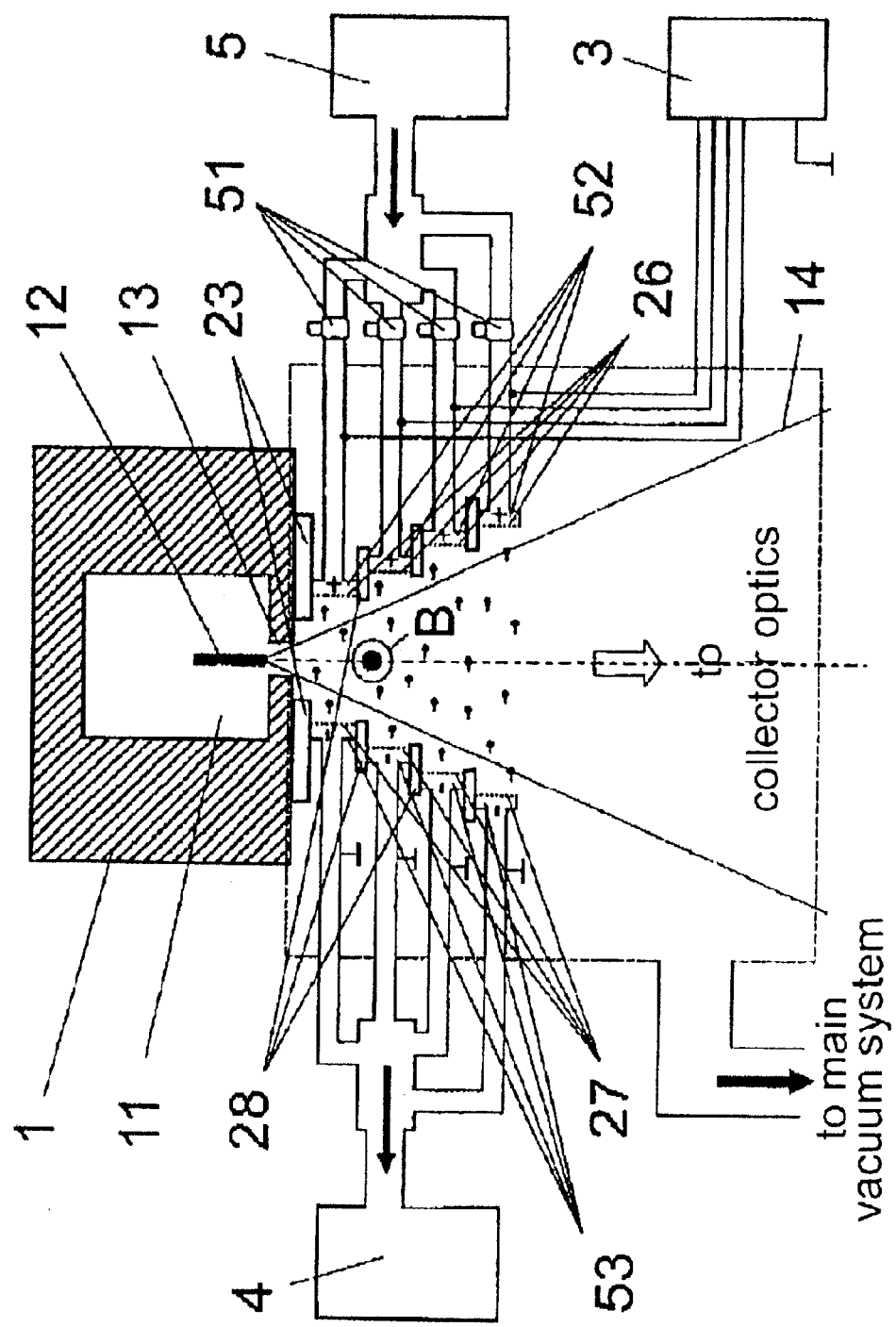
FIG. 3 shows a particularly advantageous construction of the invention in a cascade arrangement of planar electrode pairs with gas flow and magnetic field vertical thereto.

A particularly advantageous embodiment form for the debris filter according to the invention is shown in FIG. 3. In this case, the outlet opening 13 of the radiation source 1 is followed by a plurality of parallel plate-shaped electrode pairs 2 of positive electrodes 26 and negative electrodes 27 in such a way that the distance between the electrodes 26 and 27 of every electrode pair 2 increases as the distance from the radiation source 1 increases. The increasing distance is defined by the usable solid angle of the emitted beam bundle 14. The surface of the electrode pair 2 also increases with increasing distance from the radiation source 1 in accordance with the (conically divergent) beam bundle 14 emitted by the radiation source 1. The electrodes 26 and 27 of every electrode pair 2 comprise rectangular or trapezoidal perforated plates of identical size. Tightly meshed grids are equally suited as are perforated plates to make possible a flow of gas through the electrodes 26 and 27.

A gas flow flows through the beam bundle 14 from the positive electrodes 26 to the negative electrodes 27 and through the same. For this purpose, a gas supply device 5 is connected to the positive electrodes 26, while a vacuum unit 4 is connected to the negative electrodes 27. This arrangement forces positively charged particles as well as neutral particles onto paths directed in the direction of the vacuum unit 4.

The electric field is generated between the electrode pairs 2 through the use of a multiple DC power supply as voltage source 3 and guides charged particles away from their originally straight paths.

The use of an additional magnetic field B is advantageous for the deflection of fast, high-energy particles. The direction of the magnetic field B is oriented in such a way that electric and magnetic forces complement each other and impose the same effective direction on charged particles; that is, the magnetic field B—as is symbolized in FIG. 3 by the circle with the dot—is oriented orthogonal to the axis 15 of the emitted beam bundle 14 and orthogonal to the direction of the electric field and penetrates the drawing plane from bottom to top.

In this embodiment form, the debris filter comprises a plurality of electrode pairs 2 which contains a cascading arrangement of parallel grid-shaped electrodes 26 and 27 and is connected to a vacuum unit 4 and a gas supply device 5. Every electrode pair 2 is electrically isolated from the adjacent pairs 2 of electrodes by insulators 28 and is also isolated from the radiation source 1 by the insulators 23 which were already mentioned in the previous examples.

The distance between the electrodes 26 and 27 increases with increasing distance from the radiation source 1 and is defined in practice by the opening angle (predetermined by the outlet opening 13 of the radiation source 1) or by the acceptance angle of the subsequent optical element (collector optics). The surface of the arranged electrode pair 2 increases as the distance from the radiation source 1 increases until the dimensioning of the edges of the planar electrodes 26 and 27 farthest from the radiation source 1, which edges extend vertical to the drawing plane, constantly exceeds the cross section of the beam bundle 14 in the respective end position of the electrode pair 2.

The through-flow of gas is regulated by a gas supply device 5 and by a gas control unit 51 (controllable valve) independently for every electrode pair 2. The optimum gas flow is determined by the type of gas, the path length of the emitted radiation and the required transmission of the gas phase.

The gas inlets 52 are connected to the positive electrodes 26 and gas outlets 53 are connected to the negative electrodes 27, the electrodes 26 and 27 being supplied in turn by a multiple DC power supply as voltage source 3. This arrangement allows the construction of a virtually homogeneous electric field inside the cascading electrode arrangement. Additional magnetic fields lead to a supplemental force acting especially on charged particles. The direction of the magnetic field B is selected in such a way that the magnetic forces and the electric forces are summed. In the proposed version, all forces are directed toward the vacuum unit 4 connected to the gas outlets 53.

Two forces act simultaneously on the debris which is formed of neutral and charged particles and which exits from the outlet opening 13 of the radiation source 1 with the desired EUV radiation. These forces force the charged particles to change their movement direction. On the one hand, particles are accelerated in the direction of the connection of the vacuum unit 4 due to the pressure drop between the gas inlet 52 and gas outlet 53. In addition, positively charged particles undergo an acceleration in the same direction through electric and magnetic forces.

In the construction according to FIG. 3, the debris filter comprises, for example, four electrode pairs 2 of positive and negative electrodes 26 and 27. The required voltages can be adjusted therein to 0.4 kV, 0.8 kV, 1.3 kV and 2 kV for the deflection of a singly charged xenon ion (e.g., such as that exiting from the plasma 12 based on a xenon gas discharge) at a rate of $10^6$ cm/s (typical speed) on a path of 11 cm, so that the particles are deflected by 107 degrees and exit the beam bundle 14. Naturally, the voltages are also sufficient for multiply ionized particles because their deflection is greater due to their higher charge.

A magnetic field B with a magnetic induction of more than $10^{-2}$ Tesla is sufficient for the deflection of charged particles at high speeds, wherein the strength of the magnetic forces is comparable to that of the electrical forces.

It can be estimated based on the expected particle quantity that the electric current through the particles during a pulse will be about 10 amperes between electrodes 26 and 27. Therefore, capacitors (not shown) are provided for the voltage supply of the electrode pairs 2 for temporary storage of the charge. The discharge is then carried out via the particle flow during the pulsed plasma generation typically within a time period of 100 ns. Subsequently, the capacitors are charged again, which can last about 100 $\mu$s between the pulses (e.g., 200 $\mu$s at 5 kHz repetition rate).

Other design variants of the invention are possible without departing from the framework of the invention. The examples described above were based on electrode configurations having exactly parallel surfaces, at least one of which electrodes is perforated in order to generate a pressure gradient. In this respect, any modifications of the cylindrical electrode shape, including n-sided prisms and trapezoids and rounded surfaces for the planar electrode shape are clearly understood as belonging to the inventive teaching insofar as a deflection of charged particles is achieved by the action of an electric field and a deflection of uncharged particles is realized by a pressure difference. In particular, "cascades" of non-planar electrode pairs which are not expressly described should be understood as belonging to the invention with or without reinforcement through a gas feed.

While the foregoing description and drawings represent the present invention, it will be obvious to those skilled in the art that various changes may be made therein without departing from the true spirit and scope of the present invention.

Reference Numbers:

1 radiation source
11 vacuum chamber
12 plasma
13 outlet opening
14 beam bundle
15 axis
2 electrode pair
21 pipe
22 tube
23 insulator
24 perforated pipe
25 rod
26 positive electrodes
27 negative electrodes
28 insulators
3 voltage source
4 vacuum unit
5 gas feed device
51 gas control unit
52 gas inlets
53 gas outlets

What is claimed is:

1. An arrangement for the suppression of particle emission with generation of radiation based on a hot plasma, particularly with EUV radiation generation, comprising:
a vacuum chamber for the purpose of generating the hot plasma, such chamber having an outlet opening for emitting the generated radiation from the vacuum chamber in a defined solid angle;
means for generating an electric field, wherein at least one pair of electrodes with surfaces parallel to one another are provided for generating the electric field, wherein the electrodes communicate with different poles of a DC voltage source, are arranged parallel to a center axis of the beam bundle, and are positioned in such a way that the beam bundle is enclosed as closely as possible by the electrodes without the beam bundle being cut into, and wherein the electric field is oriented orthogonal to the central propagation direction of a divergent beam bundle exiting in a defined solid angle; and
means for generating a gas sink so that a resulting particle flow is oriented parallel to the direction of the electric field, which means are arranged following the outlet opening of the vacuum chamber.

2. The arrangement according to claim 1, wherein the two electrodes are constructed as concentric cylindrical jacket surfaces for generating the electric field, wherein a center electrode is arranged along the axis of the exiting beam bundle, is constructed as a thin perforated tube, is provided with a connection to a vacuum unit, and communicates with the negative pole of the DC voltage source, and an outer electrode which is constructed as a pipe that is oriented concentric to the thin tube and is connected to the positive pole of the DC voltage source is arranged around the exiting beam bundle.

3. The arrangement according to claim 2, wherein the outer electrode is an outer surface of an n-sided prism, where n is preferably greater than or equal to four.

4. The arrangement according to claim 2, wherein there is a plurality of pairs of parallel electrodes for generating the electric field, wherein the electrode pairs are electrically insulated from one another, arranged in close succession in the propagation direction of the beam bundle, and arranged in such a way that the electrodes of the pairs are at an increasingly greater distance from one another, which distance is adapted to the diameter of the beam bundle, which diameter increases as the distance from the radiation source increases, and a higher voltage is applied to the electrodes at the greater distance so that the loss of electric field strength caused by the distance is compensated to a great extent.

5. The arrangement according to claim 1, wherein two electrodes are constructed as concentric cylindrical jacket surfaces for generating the electric field, wherein a center electrode constructed as a thin rod is arranged along the axis of the exiting beam bundle and communicates with the positive pole of the DC voltage source, an outer electrode which is constructed as a perforated pipe oriented concentric to the thin rod is arranged around the exiting beam bundle, and a vacuum unit is provided for evacuating the space outside of the perforated pipe.

6. The arrangement according to claim 1, wherein for the purpose of accelerated lateral deflection of charged particles a magnetic field which is orthogonal to the center axis of the beam bundle and to the direction of the electric field is arranged immediately following the outlet opening of the vacuum chamber, so that electric and magnetic forces deflect charged particles in the same direction.

7. The arrangement according to claim 1, wherein at least one electrode pair with planar electrodes which are parallel to one another is provided for generating the electric field, wherein at least one electrode of the electrode pair which communicates with the negative pole of the DC voltage source is perforated and a connection to a vacuum unit is arranged behind the latter lateral to the propagation direction of the beam bundle.

8. The arrangement according to claim 7, wherein for the purpose of generating an effective gas flow both electrodes of a pair are perforated and a gas supply device is connected to the positive electrode and a vacuum unit is connected behind the negative electrode.

9. The arrangement according to claim 1, wherein for the purpose of generating an effective gas flow both electrodes of a pair are perforated, a gas supply device is connected to the positive electrode and a vacuum unit is connected behind the negative electrode.

10. The arrangement according to claim 9, wherein the two electrodes are grid-shaped.

11. The arrangement according to claim 10, wherein both electrodes are perforated plates.

12. The arrangement according to claim 9, wherein the gas supply device is provided for generating a highly transparent gas flow of hydrogen or deuterium.

13. The arrangement according to claim 9, wherein the gas supply device is provided for generating a highly transparent gas flow of a noble gas, particularly helium, neon, argon or krypton.

* * * * *